(12) United States Patent
Egawa

(10) Patent No.: US 6,229,215 B1
(45) Date of Patent: May 8, 2001

(54) SEMICONDUCTOR DEVICE AND MANUFACTURING METHOD THEREOF

(75) Inventor: Yoshimi Egawa, Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/177,822

(22) Filed: Oct. 23, 1998

(30) Foreign Application Priority Data

Apr. 30, 1998 (JP) .................................................. 10-121305

(51) Int. Cl.[7] ........................... H01L 23/48; H01L 23/52; H01L 29/40
(52) U.S. Cl. ........................ 257/777; 257/778; 257/686
(58) Field of Search .................................. 257/777, 778, 257/780, 781, 786, 686, 723

(56) References Cited

U.S. PATENT DOCUMENTS

| | | | |
|---|---|---|---|
| 5,239,198 | * | 8/1993 | Lin et al. . |
| 5,477,082 | * | 12/1995 | Buckley, III et al. . |
| 5,798,567 | * | 8/1998 | Kelly et al. . |
| 5,808,878 | * | 9/1998 | Saito et al. . |
| 5,854,507 | * | 12/1998 | Miremadi et al. . |

FOREIGN PATENT DOCUMENTS

| | | |
|---|---|---|
| 7-321248 | 12/1995 | (JP) . |
| 8-139225 | 5/1996 | (JP) . |
| 9-051015 | 2/1997 | (JP) . |

* cited by examiner

*Primary Examiner*—Sheila V. Clark
(74) *Attorney, Agent, or Firm*—Venable; Norman N. Kunitz

(57) ABSTRACT

In a semiconductor device 1 having a first semiconductor chip 11 mounted at a front surface of a substrate 10 and a plurality of bumps 15 formed at a rear surface of the substrate 10, a second semiconductor chip 17 is mounted at an area 16 formed at the center of the rear surface of the substrate 10 where the bumps 15 are not present.

13 Claims, 7 Drawing Sheets

SEMICONDUCTOR DEVICE AND MANUFACTURING METHOD THEREOF

BACKGROUND OF THE INVENTION

The present invention relates to a semiconductor device which is referred to as a CSP (Chip Size Package), a BGA (Ball Grid Array) or the like and a method for manufacturing this semiconductor device.

A semiconductor device which is referred to as, for instance, a BGA is shown in reference to FIG. 9 and has, a semiconductor chip 101 mounted at a front surface of an internal substrate 100 (the upper surface in FIG. 9), and the semiconductor chip 101 and the internal substrate 100 are electrically connected through wiring 102 in the prior art. Then, the semiconductor chip 101 is sealed with a resin 103 on the front surface of the internal substrate 100. In addition, the semiconductor device assumes a structure achieved by providing solder bumps (solder balls) 104 at a rear surface of the internal substrate 100 (the lower surface in FIG. 9).

In recent years, the need for achieving higher density mounting with this type of semiconductor device has become more pronounced. However, the semiconductor device in the prior art explained with reference to FIG. 9, which device fails to effectively utilize the area of the substrate over which mounting is possible when mounting at a motherboard, it is difficult to reduce the mounting area to a sufficient degree. Consequently, it is difficult to respond to the high density mounting requirement in a satisfactory manner.

Furthermore, since the reliability of the semiconductor device in the prior art, which is tested in a temperature cycling test conducted after soldering it at a motherboard is problematic, the reliability in the temperature cycling test is improved by filling the space between the semiconductor device and the motherboard with resin to hold down the electrically connected portions with the resin. However, there is a problem in that, in order to fill the space between the semiconductor device and the motherboard with resin, the number of steps to be implemented in the resin sealing process must be increased.

SUMMARY OF THE INVENTION

An object of the present invention, which has been completed by addressing the problems of the CSP or BGA semiconductor device in the prior art discussed above, is to provide a new and improved semiconductor device which achieves high density mounting by effectively utilizing the area of the substrate over which mounting is possible and a method for manufacturing this semiconductor device.

Another object of the present invention is to provide a new and improved semiconductor device with which high density mounting can be achieved without having to increase the thickness of the product and a method for manufacturing this semiconductor device.

Yet another object of the present invention is to provide a new and improved semiconductor device with which resin sealing can be implemented with ease and requiring only a small number of steps in a short time to realize a reduction in the production costs and a method for manufacturing this semiconductor device.

In order to achieve the objects described above, in a first aspect of the present invention, a semiconductor device with a first semiconductor chip mounted at a first surface of a substrate, e.g., a front surface thereof, and a plurality of bumps formed at a second surface of the substrate, e.g., a rear surface thereof, is modified in that a second semiconductor chip is mounted in an area with no bumps that is formed at a center of the rear surface of the substrate. Since the first semiconductor chip is mounted at the front surface of the substrate and the second semiconductor chip is mounted at the rear surface of the substrate in this structure, a mounting with a density twice as high over the same mounting area compared to the semiconductor device in the prior art becomes possible.

In addition, it is desirable that a through hole for passing sealing resin between the front surface and the rear surface of the substrate be provided at the substratein the semiconductor device, since this will make it possible to seal the space between the substrate front surface and the first semiconductor chip and the space between the substrate rear surface and the second semiconductor chip at the same time with the resin by supplying the resin either at the front surface or the rear surface of the substrate and passing the resin through the through hole provided at the substrate.

Furthermore, it is desirable that the electrical connection of the first semiconductor chip to the substrate front surface and/or the electrical connection of the second semiconductor chip to the substrate rear surface be achieved through a flip-chip connection, to achieve a reduction in the thickness of the entire semiconductor device.

Moreover, in a second aspect of the present invention, a method for manufacturing a semiconductor device is provided, which method includes a step for mounting a first semiconductor chip and a second semiconductor chip at a front surface and a rear surface of a substrate and a step for sealing with resin the space between the front surface of the substrate and the first semiconductor chip and the space between the rear surface of the substrate and the second semiconductor chip.

In this manufacturing method, it is desirable that the electrical connection of the first semiconductor chip to the front surface of the substrate and the electrical connection of the second semiconductor chip to the rear surface of the substrate be achieved through a flip-chip connection, to achieve a reduction in the thickness of the entire semiconductor device.

In addition, it is desirable that by supplying the resin either at the front surface or the rear surface of the substrate to pass the resin through a through hole provided at the substrate, the space between the substrate front surface and the first semiconductor chip and the space between the substrate rear surface and the second semiconductor chip be sealed with resin at the same time, since this will achieve a reduction in the length of manufacturing time and in the production costs. In this case, a side leak prevention jig should be employed to close off the area around the first semiconductor chip or the area around the second semiconductor chip at either the front surface or the rear surface of the substrate where the resin is not supplied, to prevent the resin from leaking through the space between the substrate front surface and the first semiconductor chip or through the space between the substrate rear surface and the second semiconductor chip. In addition, the side leak prevention jig may fulfill its function by blowing warm air in the area around the first semiconductor chip or the area around the second semiconductor chip to harden the resin.

Moreover, the step for sealing the space between the substrate rear surface and the second semiconductor chip with resin may be implemented after electrically connecting the semiconductor device onto the motherboard, so that the semiconductor device can be sealed with the resin and the space between the semiconductor device and the motherboard can be held down with resin at the same time to reduce the number of sealing steps.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

FIG. 1 (b) is a cross section along line A—A in FIG. 1 (a);

DETAILED DESCRIPTION OF THE PREFERRED EMBODIMENTS

The following is a detailed explanation of the preferred embodiments of the present invention adopted in a BGA (Ball Grid Array) type semiconductor device. It is to be noted that the same reference numbers are assigned to components having almost identical functions and structural features in the following explanation and the attached drawings to preclude the necessity for repeated explanation thereof.

Figure 1A:
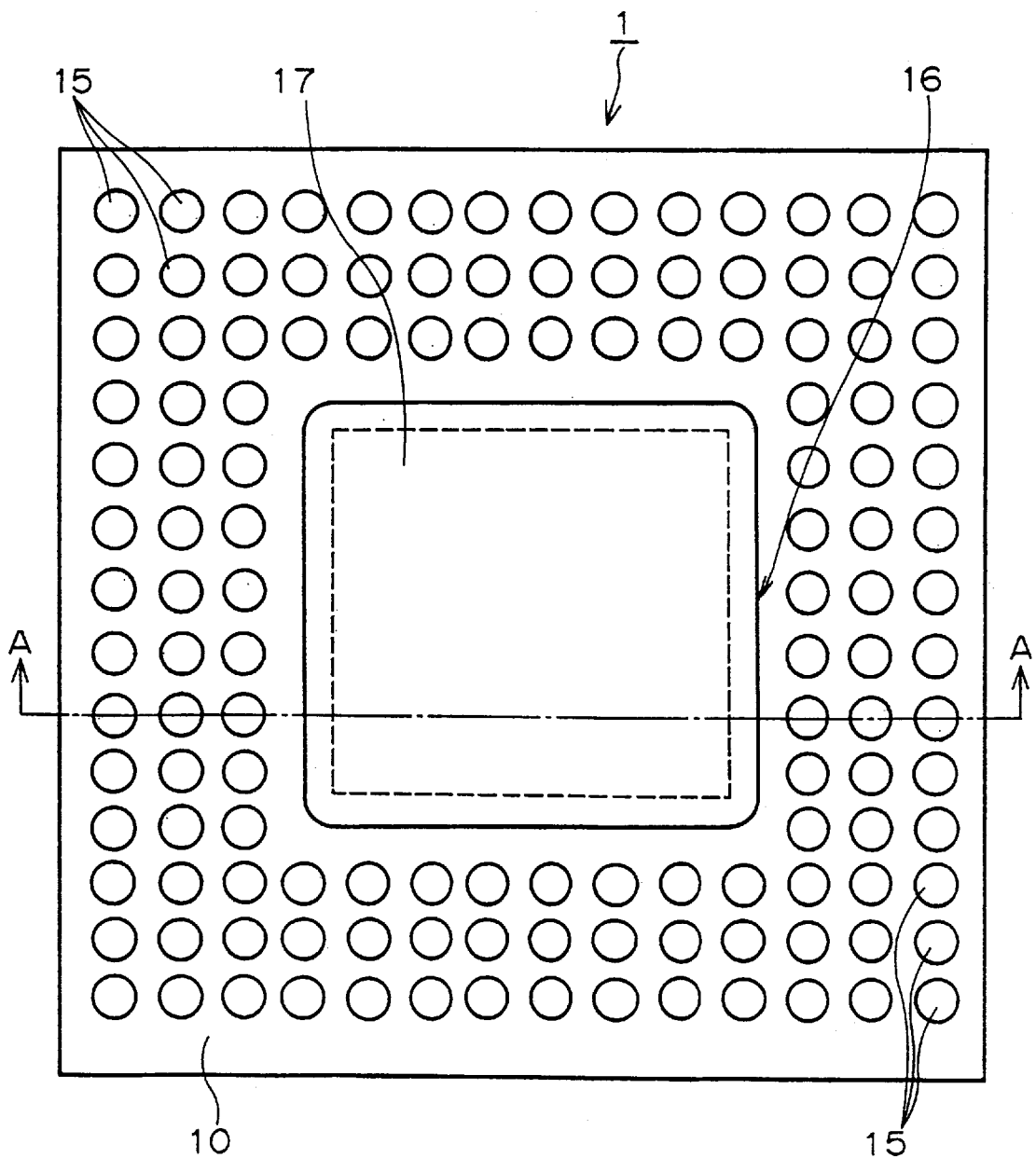
FIG. 1 (a) presents a view of the rear surface of the semiconductor device in a first embodiment of the present invention.
Figure 1B:
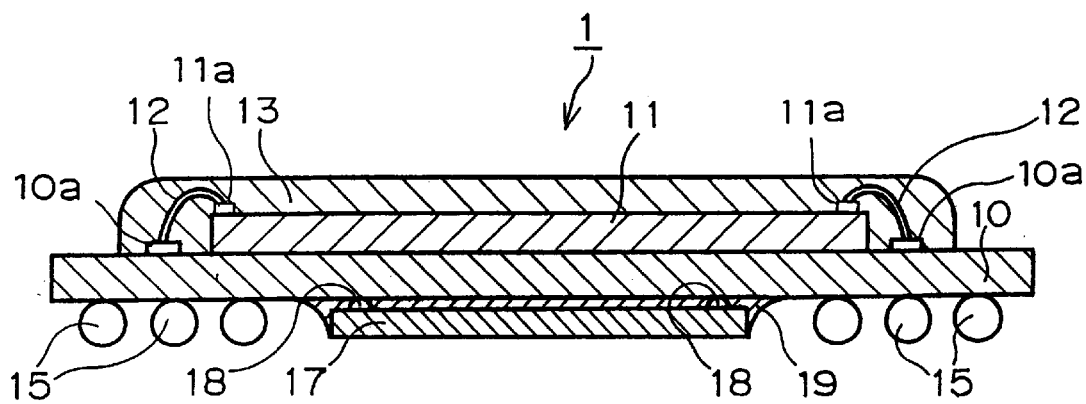

First, in reference to FIG. 1, the structure of a semiconductor device 1 in the first embodiment of the present invention is explained. In FIG. 1, (a) is a view of the rear surface of the semiconductor device 1 in the first embodiment of the present invention and (b) is a cross section along line A—A in FIG. 1 (a).

A first semiconductor chip 11 is mounted at a front surface of an internal substrate 10 (the upper surface in the example presented in the figures). In the example presented in the figures, the first semiconductor chip 11 is electrically connected to the internal substrate 10 by bonding a terminal 11a provided at the upper surface of the first semiconductor chip 11 and terminals 10a provided at the front surface of the internal substrate 10 with respective wires 12. In addition, the first semiconductor chip 11 is sealed with a resin 13 which may be, for instance, epoxy resin, at the front surface of the internal substrate 10.

A plurality connecting of bumps 15 are formed at a rear surface of the internal substrate 10 (the lower surface in the example presented in the figures). These bumps 15 may be, for instance, solder bumps or gold bumps. In addition, the bumps 15 are located in the peripheral area of the rear surface of the internal substrate 10. Furthermore, in this embodiment, an area 16 without any bumps 15 is formed at the center of the rear surface of the internal substrate 10, with a second semiconductor chip 17 mounted at the area 16. In the example presented in the figures, a flip-chip connection is achieved between the second semiconductor chip 17 and the internal substrate 10 by placing an internal connector terminal 18 provided at the upper surface of the second semiconductor chip 17 in contact with a terminal (not shown) at the rear surface of the internal substrate 10 and thus electrically connecting the second semiconductor chip 17 to the internal substrate 10. Moreover, at the rear surface of the internal substrate 10, the space between the upper surface of the second semiconductor chip 17 and the rear surface of the internal substrate 10 is sealed with a resin 19 which may be, for instance, epoxy resin.

Figure 9:
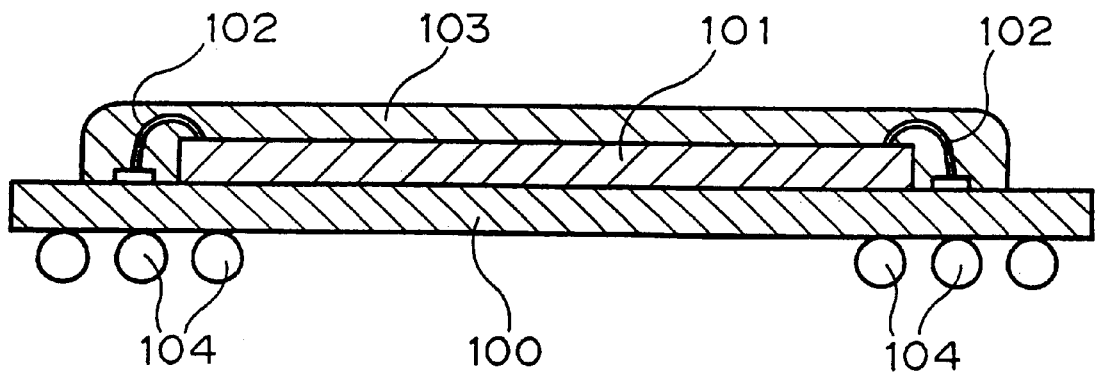
FIG. 9 is a cross section of a semiconductor device in the prior art.

With the semiconductor device 1 in the first embodiment structured as described above, in which semiconductor chips can be mounted at the two surfaces of the internal substrate 10, mounting with a density twice as high is achieved over the same mounting area compared to the semiconductor device in the prior art which has been explained earlier in reference to FIG. 9, for instance. Since flip-chip connecting of the second semiconductor chip 17 to the rear surface of the internal substrate 10 as implemented in the semiconductor device 1 requires only a small degree of increase in thickness, the thickness of the entire semiconductor device 1 hardly increases even when the second semiconductor chip 17 is mounted at the rear surface of the internal substrate 10.

Figure 2:
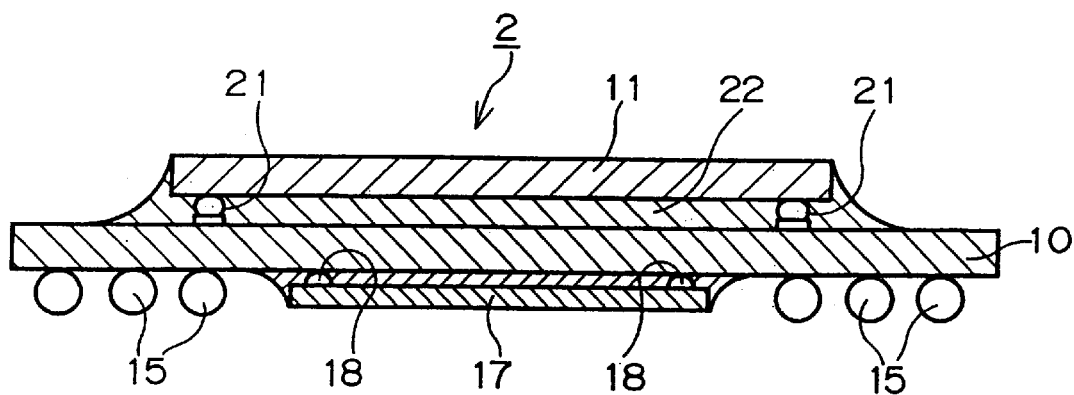
FIG. 2 is a cross section of the semiconductor device in a second embodiment of the present invention.

Next, FIG. 2 is a cross section of a semiconductor device 2 in the second embodiment of the present invention. This semiconductor device 2 assumes a structure in which an internal connector terminal 21 is provided at the lower surface of the first semiconductor chip 11 and the internal connector terminal 21 is electrically connected to the front surface of the internal substrate 10 (the upper surface in the example presented in the figure) to achieve a flip-chip connection of the first semiconductor chip 11 to the front surface of the internal substrate 10. In addition, the space between the lower surface of the first semiconductor chip 11 and the front surface of the internal substrate 10 is sealed with a resin 22 which may be, for instance, epoxy resin, at the front surface of internal substrate 10. Since other structural features are identical to those of the semiconductor device 1 in the first embodiment of the present invention explained earlier in reference to FIG. 1, the same reference numbers are assigned to the components of the semiconductor device 2 shown in FIG. 2 having almost identical structural features to those of the semiconductor device 1 explained in reference to FIG. 1 to preclude the necessity for repeated explanation thereof.

With the semiconductor device 2 in the second embodiment structured as described above, which makes it possible to achieve mounting with a density twice as high as that in the prior art over the same mounting area as in the case of the semiconductor device 1 explained earlier in reference to FIG. 1, the thickness of the entire semiconductor device 2 can be further reduced with a flip-chip connection achieved for the first semiconductor chip 11 mounted at the front surface of the internal substrate 10. Such a semiconductor device 2 is particularly effective when the entire thickness is restricted.

Figure 3:
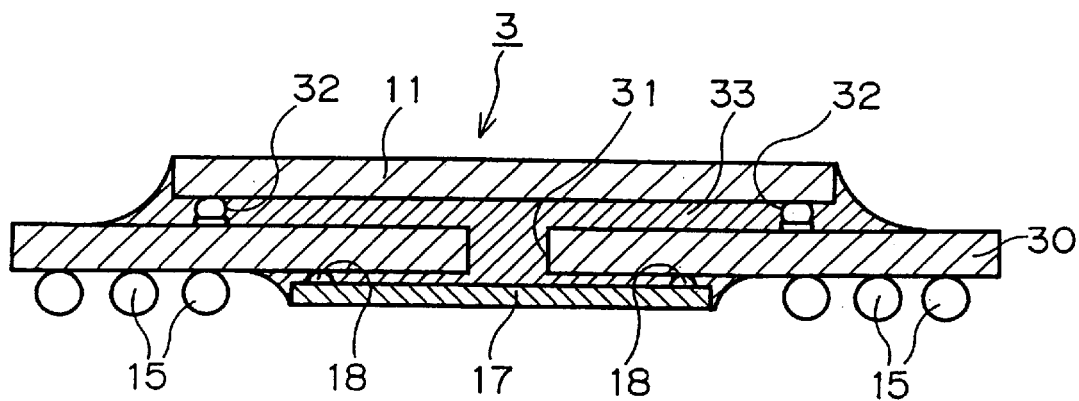
FIG. 3 is a cross section of the semiconductor device in a third embodiment of the present invention.

Next, FIG. 3 is a cross section of a semiconductor device 3 in the third embodiment of the present invention. In the semiconductor device 3, a through hole 31 is provided at an approximate center of an internal substrate 30. In addition, as in the semiconductor device 2 in the second embodiment explained earlier, a structure in which an internal connector terminal 32 provided at the lower surface of the first semiconductor chip 11 is connected at the front surface of the internal substrate 30 (the upper surface in the example presented in the figure) through a flip-chip connection is assumed in the semiconductor device 3.

With this semiconductor device 3, by passing a resin 33 such as, for instance, epoxy resin through the through hole 31 during the process for manufacturing the semiconductor device 3 which is to be explained next, the space between the front surface of the internal substrate 30 and the first semiconductor chip 11 and the space between the rear surface of the internal substrate 30 and the second semiconductor chip 17 can be sealed at the same time with the resin 33. It is to be noted that since other structural features are identical to those of the semiconductor device 2 in the second embodiment of the present invention explained earlier in reference to FIG. 2, the same reference numbers are assigned to components of the semiconductor device 3 in FIG. 3 that are identical to those of the semiconductor device 1 explained in reference to FIG. 1 to preclude the necessity for repeated explanation thereof.

Next, by using the production of the semiconductor device 3 in the third embodiment as an example, the manufacturing method in an embodiment of the present invention is explained. First, the first semiconductor chip 11 and the second semiconductor chip 17 are mounted at the front rear surfaces respectively of the internal substrate 30 where the through hole 31 is formed. In this case, as has been explained earlier, the internal connector terminal 32 provided at the lower surface of the first semiconductor 11 should be flip-chip connected (face down) to the front surface of the internal substrate 30 and the internal connector terminal 18 provided at the upper surface of the second semiconductor chip 17 should be flip-chip connected (face down) to the rear surface of the internal substrate 30. These flip-chip connections may be achieved through, for instance, Au—Au thermocompression bonding, connection using a conductive adhesive or a solder connection.

Figure 4:
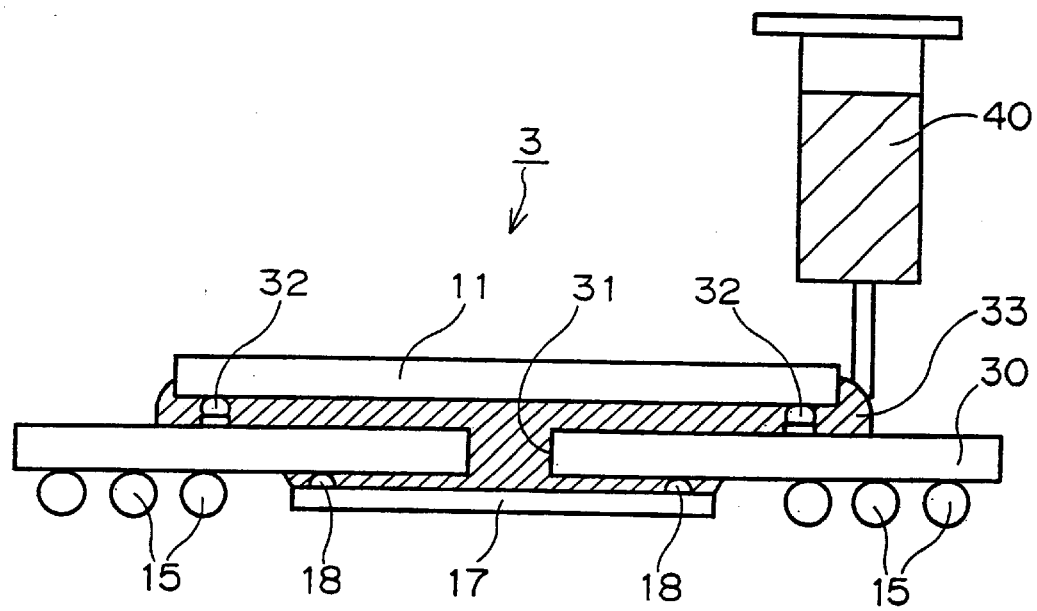
FIG. 4 illustrates a method for manufacturing the semiconductor device in the third embodiment.

Next, the space between the front surface of the internal substrate 30 and the first semiconductor chip 11 and the space between the rear surface of the internal substrate 30 and the second semiconductor chip 17 are sealed with the resin 33. In this embodiment, to implement this step, the resin 33 only needs to be supplied at either the front surface or the rear surface of the internal substrate 30. Namely, in the example presented in FIG. 4, a liquid resin 33 which may be, for instance, epoxy resin, is supplied from above using a dispenser 40 in the area around the first semiconductor chip 11 at the front surface of the semiconductor substrate 30. Because of capillary action, the resin 33 will first flow into the space between the front surface of the internal substrate 30 and the first semiconductor chip 11, then pass through the through hole 31 provided at the internal substrate 30 and subsequently to flow into the space between the rear surface of the internal substrate 30 and the second semiconductor chip 17. The semiconductor device 3 is manufactured by filling the space between the front surface of the internal substrate 30 and the first semiconductor chip 11 and the space between the rear surface of the internal substrate 30 and the second semiconductor chip 17 and then by hardening the resin 33 at a temperature of approximately 150 to 160 centigrade.

It is to be noted that the bumps 15 may be mounted around the second semiconductor chip 17 through solder bonding or the like at the rear surface of the internal substrate 30 after implementing the sealing with resin 33 in the manner described above, or the bumps 15 may be mounted in advance before flip-chip connecting the second semiconductor chip 17.

By manufacturing the semiconductor device 3 in this manner, mounting with a density twice as high as that in the prior art over the same mounting area is achieved, and furthermore, the semiconductor device 3 with an extremely small overall thickness can be obtained. In addition, by passing the resin 33 through the through hole 31 provided at the internal substrate 30 when manufacturing the semiconductor device 3, the space between the front surface of the internal substrate 30 and the first semiconductor chip 11 and the space between the rear surface of the internal substrate 30 and the second semiconductor chip 17 can be sealed with the resin 33 at the same time, which, in turn, achieves a reduction in the length of manufacturing time and to reduce the production costs.

Figure 5:
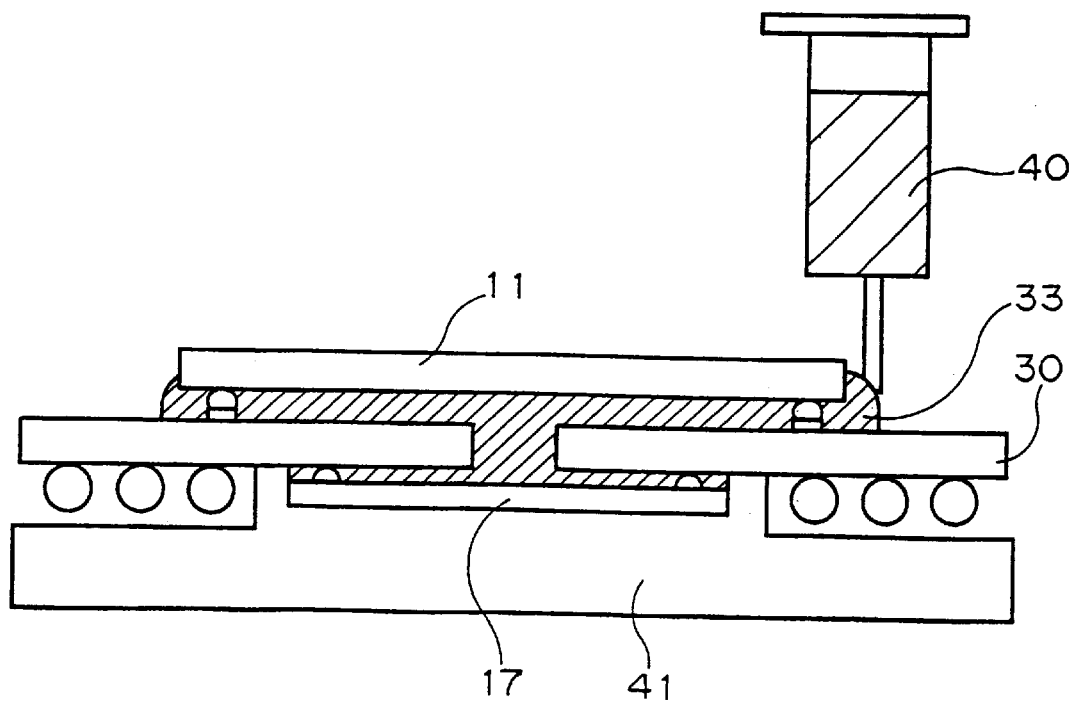
FIG. 5 illustrates a manufacturing method which employs a side leak prevention jig for closing off the area around the second semiconductor chip.

It is to be noted that when manufacturing the semiconductor device 3 with this method, there is a concern that the resin 33 may leak out through the periphery of the second semiconductor chip 17 at the rear surface of the internal substrate 30 where the resin 33 is not supplied. In order to eliminate this concern, it is desirable to provide a side leak prevention jig 41 for closing off the area around the second semiconductor chip 17 at the rear surface of the internal substrate 30 where the resin 33 is not supplied, as illustrated in FIG. 5. By supplying the resin 33 with the dispenser 40 from above at the front surface of the internal substrate 30 in a state in which the side leak prevention jig 41 closes off the area around or the vicinity of the second semiconductor chip 17 and then hardening the resin 33, the resin 33 can be prevented from leaking through the space between the rear surface of the internal substrate 30 and the second semiconductor chip 17. Thus, the resin 33 is prevented from leaking out to adhere to areas where it is not required, only the minimum quantity of the resin 33 is used and a clean finish is achieved. It is to be noted that the side leak prevention jig 41 should be constituted of a material having good separation property so that it will not become adhered to the resin 33 too easily.

Figure 6:
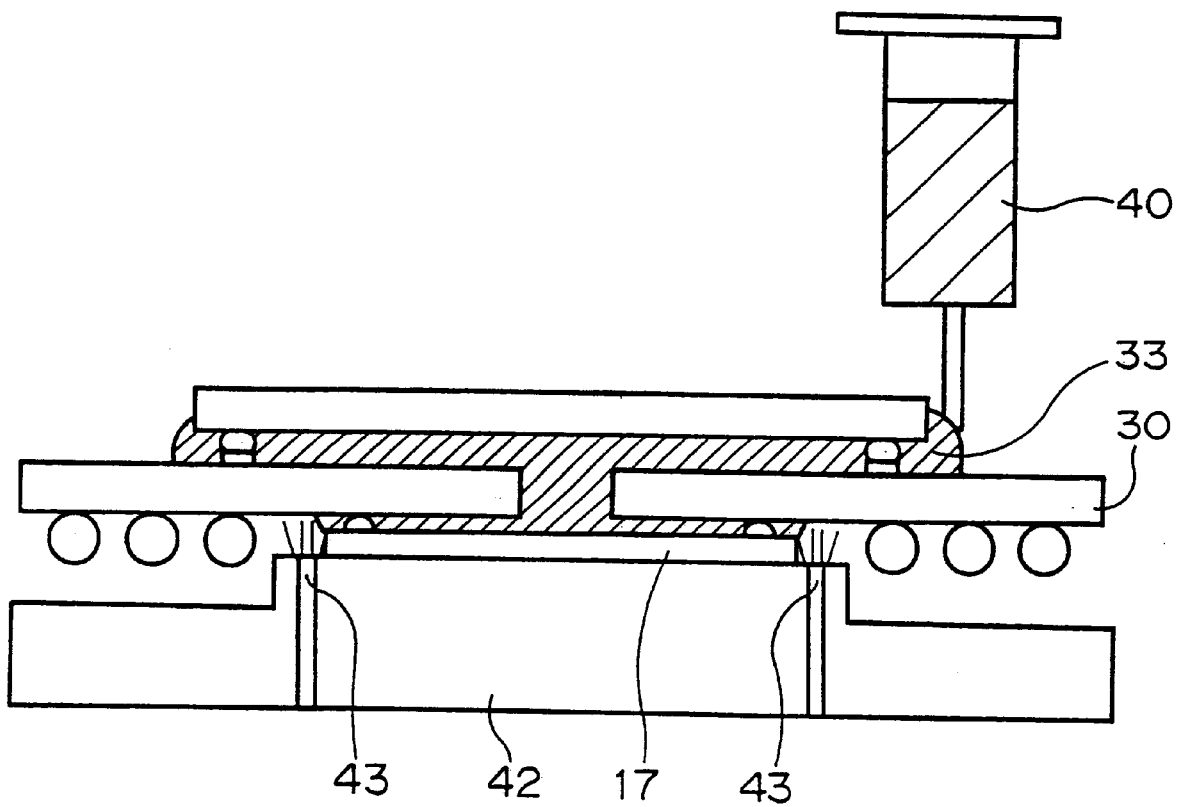
FIG. 6 illustrates a manufacturing method that employs a side leak prevention jig provided with an air outlet port.

Alternatively, as illustrated in FIG. 6, a structure in which air outlet ports 43 are provided at a side leak prevention jig 42 so that warm air at a temperature of approximately 150 to 160 centigrade is supplied to the area around the second semiconductor chip 17 at the rear surface of the internal substrate 30 through the air outlet ports 43 may be assumed. This structure will make it possible to harden the resin 33 supplied through the dispenser 40 around the periphery of the second semiconductor chip 17 to prevent the resin 33 from leaking through the space between the rear surface of the internal substrate 30 and the second semiconductor chip 17, as in the example explained earlier in reference to FIG. 5.

Next, the manufacturing method in another embodiment of the present invention is explained using the production of the semiconductor device 3 in the third embodiment.

First, as in the previous embodiment, the first semiconductor chip 11 and the second semiconductor chip 17 are respectively mounted at the front surface and the rear surface of the internal substrate 30 where the through hole 31 is formed. In this case, too, it is desirable to achieve flip-chip connections (face down) for the first semiconductor chip 11 and the second semiconductor chip 17 relative to the internal substrate 30.

Next, at the rear surface of the internal substrate 30, the bumps 15 are mounted through solder bonding or the like at specific positions around the second semiconductor chip 17. It is to be noted that the bumps 15 may be mounted at the rear surface of the internal substrate 30 in advance before flip-chip connecting the second semiconductor chip 17.

Figure 7:
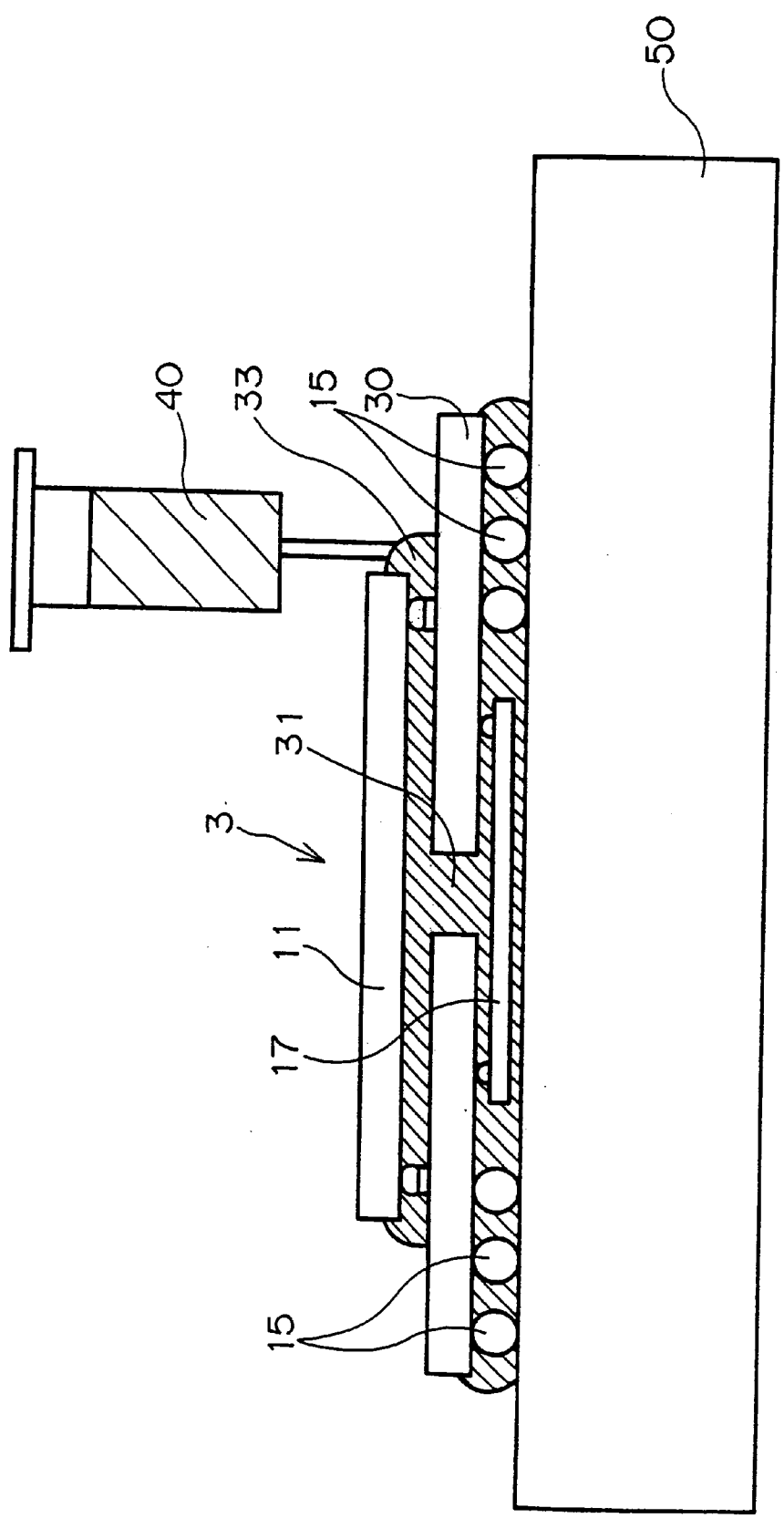
FIG. 7 illustrates a manufacturing method in another embodiment of the present invention.

Then, the semiconductor device 3 is placed on a motherboard 50, as illustrated in FIG. 7 while ensuring that the first semiconductor chip 11 and the second semiconductor chip 17 are not destroyed, and by achieving temporary mounting through local air blow or through the use of an adhesive or the like, the bumps 15 at the rear surface of the internal substrate 30 are electrically connected onto the motherboard 50.

In the next step, the space between the front surface of the internal substrate 30 and the first semiconductor chip 11 and the space between the rear surface of the internal substrate 30 and the second semiconductor chip 17 are sealed with the resin 33. During this step, too, as in the previous example, the liquid resin 33, which may be, for instance, epoxy resin, is supplied from above with the dispenser 40 to the area around the first semiconductor chip 11 at the front surface of the internal substrate 30. This will induce capillary action to cause the resin 33 to travel through the space between the front surface of the internal substrate 30 and the first semiconductor chip 11 and through the through hole 31 and then to flow into the space between the rear surface of the internal substrate 30 and the second semiconductor chip 17.

In addition, in this embodiment, the supply of the liquid resin 33 is sustained through the dispenser 40 even after the space between the rear surface of the internal substrate 30 and the second semiconductor chip 17 has been filled with the resin 33. This will result in the resin 33 flowing out through the periphery of the second semiconductor chip 17 at the rear surface of the internal substrate 30 so that, as illustrated in FIG. 7, the resin 33 will flow into and fill the space between the rear surface of the internal substrate 30 and the upper surface of the motherboard 50 and the space between the lower surface of the second semiconductor chip 17 and the upper surface of the motherboard 50. After filling the space between the front surface of the internal substrate 30 and the first semiconductor chip 11, the space between the rear surface of the internal substrate 30 and the second semiconductor chip 17 and the space between the semiconductor device 3 and the motherboard 50 with the resin 33 in this manner, the resin 33 is hardened at a temperature of approximately 150 to 160 centigrade.

Figure 8:
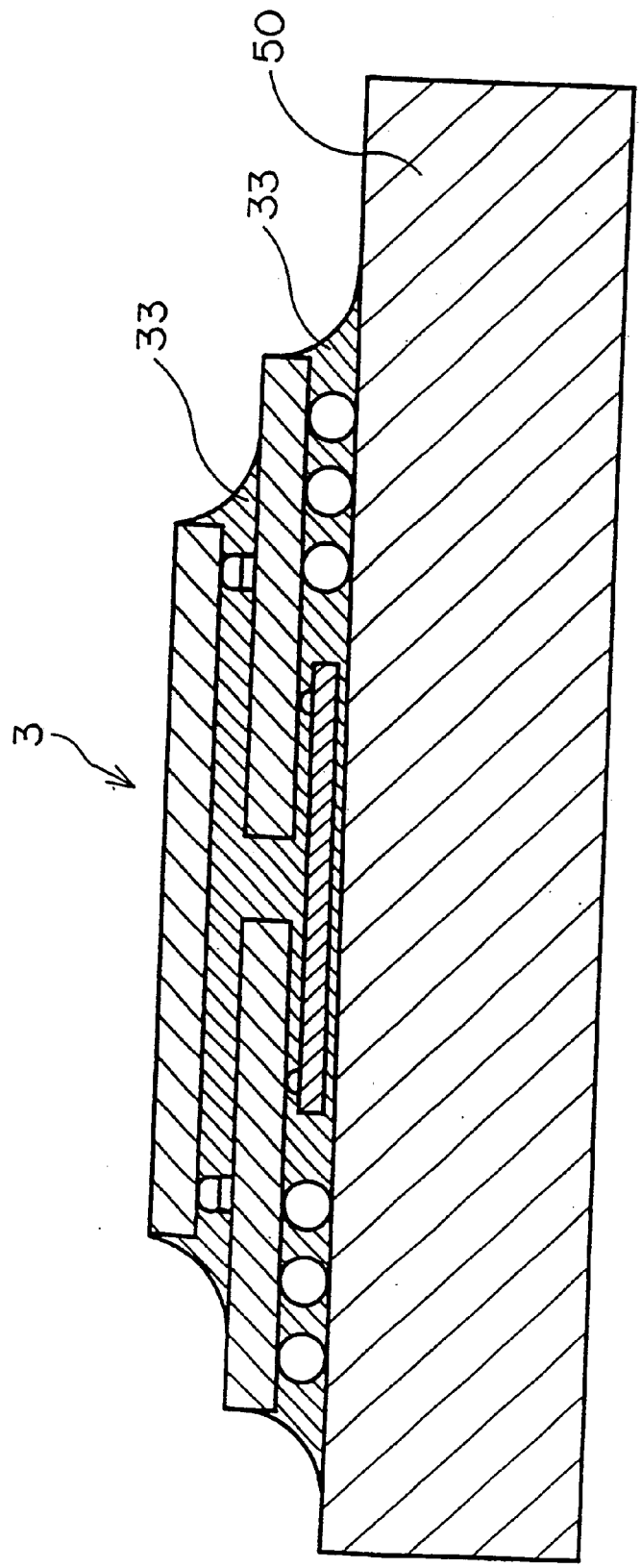
FIG. 8 is a cross section of a semiconductor device manufactured through the manufacturing method in the other embodiment.

Thus, the resin sealing of the semiconductor device 3 and the resin sealing of the space between the semiconductor device 3 and the motherboard 50 can be achieved at the same time, thereby achieving a reduction in the number of sealing steps. FIG. 8 is a cross section illustrating the semiconductor device 3 manufactured on the motherboard 50 in this manner. In the manufacturing method in this embodiment, by implementing the resin sealing of the semiconductor device 3 and the resin sealing between the semiconductor device 3 and the motherboard 50 at the same time, the semiconductor device 3 can be held onto the motherboard 50 with the resin 33 as it is manufactured, to achieve an improvement in the reliability tested in a temperature cycling test. In addition, since only one sealing step needs to be implemented while normally three steps are required, the length of manufacturing time can be reduced to approximately ⅓. It is to be noted that when the resin sealing of the semiconductor device 3 and the resin sealing between the semiconductor device 3 and the motherboard 50 are to be implemented at the same time in this manner, a side leak prevention jig similar to that explained earlier in reference to FIGS. 5 or 6 may be employed to ensure that the resin 33 will not leak out through the space between the semiconductor device 3 and the motherboard 50.

While the invention has been particularly shown and described with respect to a semiconductor device in the preferred embodiments thereof by referring to the attached drawings, the present invention is not limited to these examples and it will be understood by those skilled in the art that various changes in form and detail may be made therein without departing from the spirit, scope and teaching of the invention.

For instance, while the explanation has been given on the embodiments above which adopt the present invention in a BGA type semiconductor device, it goes without saying that the present invention may be adopted in a semiconductor device other than a BGA type semiconductor device.

The entire disclosure of Japanese Patent Application No.10-121305 filed on Apr. 30, 1998 including specification, claims, drawings and summary is incorporated herein by reference in its entirety.

What is claimed is:

1. A semiconductor device comprising:
    a substrate having a first surface and a second surface;
    a first semiconductor chip mounted at said first surface of said substrate;
    a plurality of connecting bumps, for connection to an external connecting element, formed at a first roughly peripheral area of said second surface of said substrate; and
    a second semiconductor chip mounted at a second approximately central area of said second surface of said substrate via a plurality of connecting terminals disposed between the second semiconductor chip and the substrate; and
    a resin disposed between said second semiconductor chip and said second surface of said substrate, with the resin sealing a gap between said second semiconductor chip and said second surface of said substrate and surrounding and sealing each of said connecting terminals.

2. A semiconductor device according to claim 1, wherein:
    said resin further seals electrically connected portions of said first semiconductor chip and said first surface of said substrate.

3. A semiconductor device according to claim 1, wherein:
    said substrate has a through hole, through which a liquid resin can be passed, formed between said first surface and said second surface of said substrate.

4. A semiconductor device according to claim 1, wherein:
    said first semiconductor chip is electrically connected to said substrate through wire bonding.

5. A semiconductor device according to claim 1, wherein:
    at least one of said first semiconductor chip and said second semiconductor chip is electrically connected to said substrate through a flip-chip connection.

6. A semiconductor device according to claim 1, wherein a motherboard is electrically connected to said connecting bumps.

7. A semiconductor device mounted on a motherboard comprising:
    a substrate having a first surface and a second surface;
    a first semiconductor chip mounted at said first surface of said substrate; and,
    a plurality of connecting bumps formed at a first area of said second surface of said substrate;

a second semiconductor chip mounted at a second area of said second surface of said substrate via a plurality of connecting terminals disposed between the second semiconductor chip and the substrate;

a resin disposed between said second semiconductor chip and said second surface of said substrate, and surrounding and sealing each of said connecting terminals; and, wherein said motherboard is electrically connected to said connecting bumps; and, said resin further seals electrically connected portions between said first semiconductor chip and said first surface of said substrate and an electrically connected portion between said connecting bumps at said substrate and said motherboard.

8. A semiconductor device comprising:

a substrate having a first surface and a second surface, and having a through-hole formed between said first surface and said second surface;

a first semiconductor chip mounted at said first surface of said substrate via a plurality of connecting terminals disposed between a surface of said first semiconductor chip facing said substrate and said first surface of the substrate;

a plurality of connecting balls formed at a first area of said second surface of said substrate;

a second semiconductor chip mounted at a second area of said second surface of said substrate via a plurality of connecting terminals disposed between a surface of the second semiconductor chip facing the substrate and the substrate; and a resin disposed between at least said second semiconductor chip and said second surface of said substrate, extending through said through hole and surrounding and sealing at least each of the connecting terminals for said second semiconductor chip.

9. A semiconductor device according to claim 8, wherein:

said connection balls are formed in a roughly peripheral area of said second surface, and said second semiconductor chip is mounted at an approximate central area of said second surface.

10. A semiconductor device according to claim 8, wherein:

said resin is further disposed between said first semiconductor chip and said first surface of said substrate and surrounds and seals each of the connecting terminals between said first semiconductor chip and said first surface of said substrate.

11. A semiconductor device according to claim 8, wherein:

said first semiconductor chip and said second semiconductor chip are electrically connected to said substrate through a flip-chip connection.

12. A semiconductor device according to claim 8, wherein a motherboard is electrically connected to said connection balls.

13. A semiconductor device according to claim 12, wherein:

said resin further surrounds and seals each of the connecting terminals between said first semiconductor chip and said first surface of said substrate and electrically connected portion between said connecting balls on said second surface of said substrate and said motherboard.

* * * * *